United States Patent
Oonishi et al.

(10) Patent No.: US 10,056,227 B2
(45) Date of Patent: Aug. 21, 2018

(54) FOCUSED ION BEAM APPARATUS

(71) Applicant: HITACHI HIGH-TECH SCIENCE CORPORATION, Minato-ku, Tokyo (JP)

(72) Inventors: Tsuyoshi Oonishi, Tokyo (JP); Toshiyuki Iwahori, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 13 days.

(21) Appl. No.: 15/461,404

(22) Filed: Mar. 16, 2017

(65) Prior Publication Data

US 2017/0271122 A1    Sep. 21, 2017

(30) Foreign Application Priority Data

Mar. 18, 2016   (JP) .................................. 2016-055757

(51) Int. Cl.
| | |
|---|---|
| *G01N 23/00* | (2006.01) |
| *H01J 37/20* | (2006.01) |
| *H01J 37/244* | (2006.01) |
| *H01J 37/26* | (2006.01) |
| *H01J 37/305* | (2006.01) |

(52) U.S. Cl.
CPC ............ *H01J 37/20* (2013.01); *H01J 37/244* (2013.01); *H01J 37/26* (2013.01); *H01J 37/3056* (2013.01); *H01J 2237/20207* (2013.01); *H01J 2237/20214* (2013.01); *H01J 2237/20235* (2013.01); *H01J 2237/2802* (2013.01); *H01J 2237/31745* (2013.01); *H01J 2237/31749* (2013.01)

(58) Field of Classification Search
None
See application file for complete search history.

(56) References Cited

U.S. PATENT DOCUMENTS

| | | | | |
|---|---|---|---|---|
| 7,015,483 | B2 * | 3/2006 | Suzuki ................. | H01J 37/185 250/309 |
| 2002/0050565 | A1 * | 5/2002 | Tokuda ................ | G01N 23/225 250/310 |
| 2004/0251413 | A1 * | 12/2004 | Suzuki ................. | H01J 37/185 250/309 |

FOREIGN PATENT DOCUMENTS

| | | | | |
|---|---|---|---|---|
| JP | 2005005108 A | * | 1/2005 | ............ H01J 37/185 |
| JP | 2008270073 | | 11/2008 | |
| JP | 4297736 | | 4/2009 | |

* cited by examiner

*Primary Examiner* — Andrew Smyth
(74) *Attorney, Agent, or Firm* — Adams & Wilks

(57) ABSTRACT

A focused ion beam apparatus includes a sample tray on which a sample is placed, and a focused ion beam column for irradiating the sample with a focused ion beam to obtain a micro sample-piece. A sample chamber contains therein the sample tray and the focused ion beam column. A side-entry-type carrier is inserted into and removed from the sample chamber, with a front end side of the carrier holding the sample-piece. A sample-piece moving unit moves the sample-piece between the sample tray and the carrier. The sample tray is movable along at least x, y, and z axes, and an end of the sample tray is provided with a carrier engagement part releasably engageable with the carrier so that movement of the sample tray is accompanied by corresponding movement of the carrier.

19 Claims, 4 Drawing Sheets

FOCUSED ION BEAM APPARATUS

CROSS REFERENCE TO RELATED APPLICATION

This application claims the benefit of Japanese Patent Application No. 2016-055757, filed Mar. 18, 2016, which is hereby incorporated by reference in its entirety into this application.

BACKGROUND OF THE INVENTION

1. Technical Field

The present invention relates generally to a focused ion beam apparatus that can cut off a micro sample-piece including an observation target portion from a sample by using a focused ion beam.

2. Description of the Related Art

For example, as a method of analyzing or observing an internal structure of a sample such as a semiconductor device, etc. or performing a three-dimensional observation thereof, a method of cross-section processing and observation (for example, refer to Patent Document 1) is well known. The method includes: by using a composite charged particle beam device having a focused ion beam (FIB) column and an electron beam (EB) column, conducting both cross-section processing using a focused ion beam (FIB) and scanning electron microscopy (SEM) observation using an electron beam (EB) irradiating a cross section.

The method of cross-section processing and observation is a method called "Cut & See" in which cross-section processing using a FIB is referred to as "Cut" and cross-section observation using an EB is referred to as "See", Cut and See are repeated to obtain a three-dimensional image. In the method, by using the obtained three-dimensional image, it is possible to view a three-dimensional shape of a target sample in various directions. In addition, it is possible to reproduce an arbitrary cross-section image of a target sample, something impossible using other methods.

In the meantime, a secondary electron beam diffuses in SEM, and thus there is a limit to high magnification (high resolution) observation, and obtained information is limited to around the surface of a sample. Therefore, transmission electron microscopy (TEM) that transmits electrons through a sample processed in a thin film shape is well known. With TEM, it is possible to observe an internal structure of a sample, and to obtain an observation image with high magnification (high resolution) in comparison with SEM. The above-described cross section obtaining processing using an FIB may be applied to obtain a small sample (hereinafter, referred to as a micro sample-piece) processed in a thin film for TEM.

However, generally, it is desired for TEM to be performed under a high voltage and high vacuum in comparison with SEM. Therefore, a TEM apparatus is larger than an SEM apparatus, and it is difficult to integrate the apparatus for TEM with an FIB device. For those reasons, in a case of that a micro sample-piece, which is obtained by cross section processing using an FIB, is used as an observation sample for TEM, it is generally known that configurations can easily move the sample between the FIB device and the TEM apparatus by using a common sample holder for an FIB device and a TEM apparatus (for example, refer to Patent Document 2).

In a focused ion beam apparatus disclosed in Patent Document 2, an FIB micro sampling method is applied. In the method, FIB processing and mechanical probe operation are organized. In addition, a portion for analysis is cut off from a sample to obtain a micro sample-piece, and is placed on a sample tray referred to as a mesh for TEM analysis. A common side-entry-type stage for the FIB device and the TEM apparatus is provided in order to prevent a mesh from being replaced onerously due to moving a sample between the FIB device and the TEM apparatus. In addition, when a micro sample-piece is cut off from a bulk sample, processing is performed by using a sample tray for an FIB such that a side-entry-type holder is moved to an evasion position. When the micro sample-piece is fixed to a mesh on the side-entry-type holder, the sample tray for an FIB is moved to an evasion position.

DOCUMENTS OF RELATED ART (Patent Document 1) Japanese Patent Application Publication No. 2008-270073
(Patent Document 2) Japanese Patent No. 4297736

SUMMARY OF THE INVENTION

However, in Patent Document 2, there is a problem that a sample stage on which a sample is placed for FIB processing and a side-entry-type stage moving and introducing a micro sample-piece, which is obtained by processing, into a TEM apparatus require respective operation units to enable a micro-movement in a sample chamber. For example, a sample stage and a side-entry-type stage are provided with respective operation units moving along each of X, Y, and Z-axes. Therefore, a structure of the side-entry-type stage that is inserted into and removed from a sample chamber is particularly complex, and thus it is difficult to operate the stage.

In addition, the sample stage and the side-entry-type stage are individually operated in the sample chamber, and thus there are limits to a movable range of the sample stage and the size of the sample in order to prevent moving lines of the sample stage and of the side-entry-type stage from interfering with each other.

Accordingly, the present invention has been made keeping in mind the above problems occurring in the related art, and an object of the present invention is to provide a focused ion beam apparatus easily moving a micro sample-piece of an observation target between the focused ion beam apparatus and a sample observation apparatus by using simple configurations.

In order to accomplish the above object, the present invention provides a focused ion beam apparatus.

That is, the focused ion beam apparatus includes: a sample tray on which a sample is placed; a focused ion beam column irradiating the sample by using a focused ion beam to obtain a micro sample-piece; a sample chamber receiving the sample tray and the focused ion beam column therein; a side-entry-type carrier being inserted into and removed from the sample chamber, with a front end side holding the micro sample-piece; and a sample-piece moving unit moving the micro sample-piece between the sample tray and the carrier, wherein the sample tray is provided to be movable along at least an x-axis along a horizontal plane, a y-axis perpendicular to the x-axis, and a z-axis along a vertical direction respectively, and at an end of the sample tray, a carrier engagement part, detachably engaged to the carrier, is provided which moves the carrier in accompaniment to the movement of the sample tray.

According to the focused ion beam apparatus according to an embodiment of the present invention, the carrier is fastened with the sample tray through the carrier engagement part, whereby the carrier is moved without a moving unit along X, Y, and Z-axes. Therefore, the carrier may be lightened and may be provided in a small size, and the operation unit may be omitted. In addition, when moving the sample tray, it is unnecessary to move the carrier individually, whereby it is easy to operate the sample tray and the carrier, and the micro sample-piece of the observation target may be easily moved by using simple configurations.

The sample chamber may be provided with a load lock unit keeping the sample chamber airtight and enabling the carrier to be inserted into and removed from the sample chamber.

The sample tray may be further provided with a table enabling the sample to rotate around the z-axis.

The sample chamber may be further provided with a tilting member enabling the sample tray to rotate around the x-axis.

The sample chamber may be further provided with a carrier rotating member enabling the carrier to rotate around the x-axis.

The carrier may be provided with a holder having a mesh holding the micro sample-piece and a holder adaptor maintaining the holder detachable.

The carrier engagement part may be engaged with the holder adaptor.

The carrier engagement part may be further provided with an insulation member for carrying out insulation between the carrier and the carrier engagement part.

The sample chamber may be further provided with a transmission electron detector for observing a transmission electron image of the micro sample-piece held on the carrier.

According to the focused ion beam apparatus, it is possible to easily move a micro sample-piece of an observation target between the focused ion beam apparatus and a sample observation apparatus by using simple configurations.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
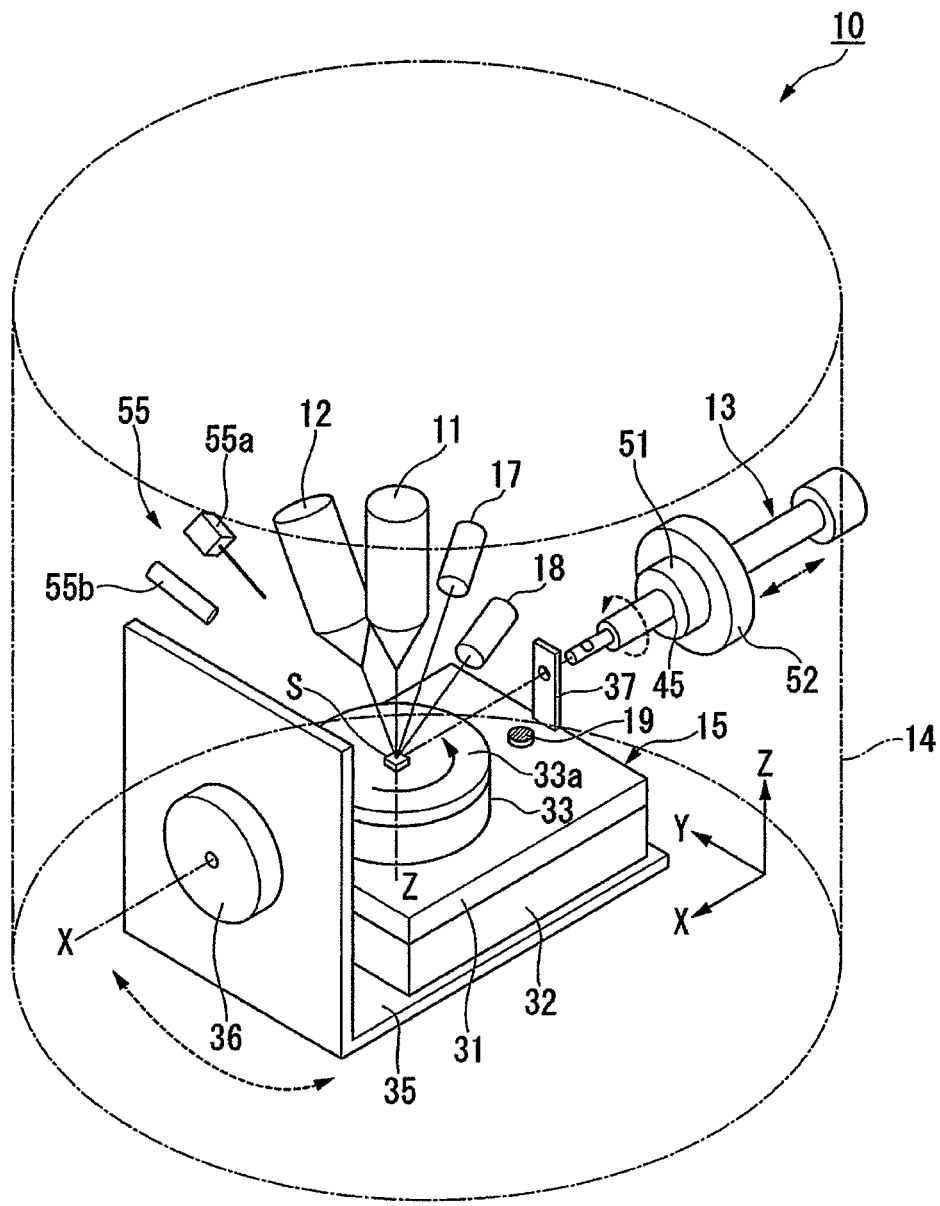
FIG. 1 is a schematic configuration view showing a focused ion beam apparatus according to an embodiment of the present invention.

Hereinafter, a focused ion beam apparatus according to embodiments of the present invention is described below with reference to the accompanying drawings. Respective illustrative embodiments described below are specific examples for easily understanding the scope of the present invention and do not limit the present invention unless specified otherwise. In addition, in the drawings used in the following description, major components may be enlarged and illustrated in order to make characteristics of the present invention easier to understand, and a dimensional ratio of each component may not be the same as that of the actual one.

FIG. 1 is a schematic configuration view showing a focused ion beam apparatus according to an embodiment of the present invention.

According to the embodiment of the present invention, an apparatus 10 for processing and observing a sample (focused ion beam apparatus) includes: a focused ion beam (FIB) column 11; an electron beam (EB) column 12; a sample tray 15 on which a sample S is placed; a sample chamber 14 receiving the sample tray and the focused ion beam column therein; and a side-entry-type carrier 13 inserted into and removed from the sample chamber 14.

The focused ion beam column 11 and the electron beam column 12 are fixed to the sample chamber 14.

The apparatus 10 for processing and observing a sample further includes: a secondary electron detector 17; and an EDS detector 18. The secondary electron detector 17 irradiates a sample S by using a focused ion beam or an electron beam, and detects a secondary electron generated from the sample S. In addition, the EDS detector 18 irradiates a sample S by using an electron beam, and detects an X-ray generated from the sample S. The X-ray generated from the sample S includes characteristic X-rays for each substance of a sample S, and a substance of a sample S may be specified by the characteristic X-rays.

In addition, instead of the secondary electron detector 17, it is desirable to use a back-scattered electron detector. The back-scattered electron detector detects back-scattered electrons that are back-scattered by an electron beam from a sample S. By using the back-scattered electrons, it is possible to obtain a cross-section image in which convex-concave information of a cross section is reduced and mass contrast of materials is applied. In addition, the secondary electron detector 17 and the back-scattered electron detector may be provided in an SEM housing.

In addition, instead of the EDS detector 18, it is desirable to use an EBSD detector. In the EBSD detector, when a crystalline material is irradiated by an electron beam, a diffraction figure, namely, an EBSD pattern is observed by back-scattering diffraction of an electron line that occurs at a surface of a sample S, and information of crystal orientation of the sample S is obtained. By measuring and analyzing the EBSD pattern, information of distribution of crystal orientation in a micro region of the sample S is obtained.

In addition, the focused ion beam apparatus 10 may include at least a focused ion beam (FIB) column 11 and a side-entry-type carrier 13, and may perform sample processing by using a focused ion beam without an electron beam column 12 or an EDS detector 18.

The sample chamber 14 is, for example, a pressure resistant housing having an airtight structure where internal pressure may be reduced. In the sample chamber 14, a vacuum pump (not shown) is provided to reduce internal pressure.

The sample tray 15 is provided with a body unit 31, a moving member 32 moving the body unit 31, and a turntable (table) 33 provided on the body unit 31. The moving member 32 moves the body unit 31 on which the turntable 33 is placed, as shown in FIG. 1, on a x-axis along a horizontal plane, a y-axis perpendicular to the x-axis, and a z-axis along a vertical direction. Movement of the moving member 32 is controlled by a control device (not shown) controlling the entire apparatus 10 for processing and observing a sample.

The turntable 33 is, for example, provided in a cylindrical shape, and enables a sample load surface 33a on which the sample S is placed to rotate on the z-axis. Rotation of the turntable 33 is controlled by a control device (not shown) controlling the entire apparatus 10 for processing and observing a sample.

The sample tray 15 is, for example, supported by a sample tray supporting member 35 provided in an approximate L letter shape. In addition, the sample tray supporting member 35 is fixed to a tilting member 36 provided at a side wall of the sample chamber 14. As shown in FIG. 1, the tilting member 36 tilts the sample tray supporting member 35 on the x-axis along a horizontal plane. Thus, the entire sample tray 15 including the turntable 33 may tilted on the x-axis. By tilting the turntable 33 on the x-axis, the sample load surface 33a may be tiled at an arbitrary angle relative to a horizontal plane. A tilt of the tilting member 36 is controlled by a control device (not shown) controlling the entire apparatus 10 for processing and observing a sample.

In addition, an end of the body unit 31 of the sample tray 15 is provided with a carrier engagement part 37 detachably fastened with the carrier 13.

Figure 2:
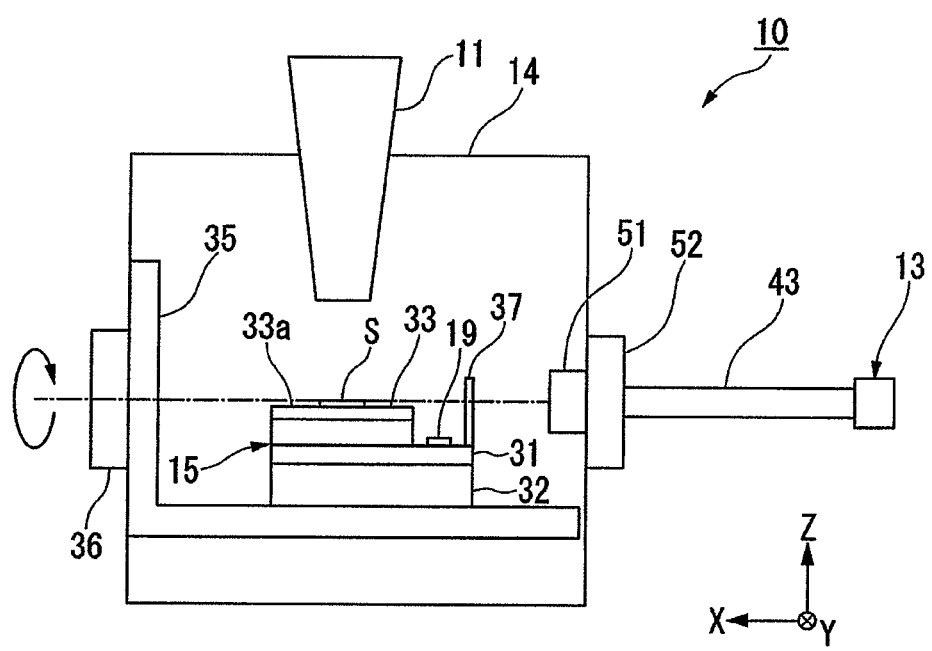
FIG. 2 is a vertical cross-sectional view of an apparatus for processing and observing a sample.
Figure 3:
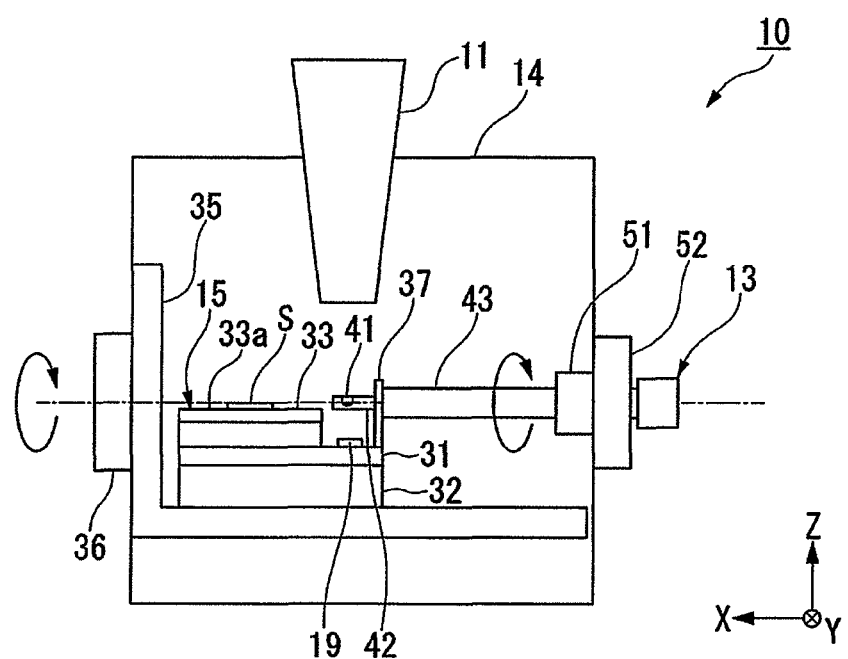
FIG. 3 is a vertical cross-sectional view of an apparatus for processing and observing a sample.

FIGS. 2 and 3 are vertical cross-sectional views of an apparatus for processing and observing a sample. FIG. 2 shows a condition that the carrier is removed from the sample chamber, and FIG. 3 shows a condition that the carrier is inserted into the sample chamber. In addition, in order to clarify operations of the carrier, descriptions of the electron beam column, the secondary electron detector, and the EDS detector, etc. are omitted in FIGS. 2 and 3.

The carrier (side-entry-type holder) 13 is provided with both a holder 42 having a mesh 41 at a front end of the holder, and a holder adaptor 43 detachably holding the holder 42. The holder and the holder adaptor are provided in an approximately cylindrical shape.

The mesh 41 is, for example, a mesh shape member on which a micro sample-piece, which is obtained by processing the sample S with a focused ion beam, for TEM analysis is placed. The mesh 41 is, for example, formed by fixing a copper net in a semicircular shape or fixing a micro filler produced by silicon processes to a semicircular shaped thin plate.

The mesh 41 is, for example, supported by a groove 42a (referring to FIG. 4) formed at a front end of the holder 42.

The holder adaptor 43 includes, for example, a penetrating hole 45 (referring to FIG. 4) therein along a length direction of the adaptor, and the holder 42 is inserted into and removed from the penetrating hole 45. With such a configuration, when an opening through which the carrier (side-entry-type holder) 13 is inserted into the sample chamber 14 matches with a cross sectional shape of the holder adaptor 43, the holder 42 held by the holder adaptor 43 may be provided in various shapes.

At a side of the sample chamber 14, a load lock unit 51 sealing the sample chamber 14 and enabling the carrier 13 to be inserted into and removed from the sample chamber 14, and a carrier rotating member 52 holding the carrier 13 to be rotatable on the x-axis are provided.

The load lock unit 51 is, for example, a shutter for maintaining a vacuum condition in the sample chamber 14 when inserting the carrier 13 into the sample chamber 14 from the outside, or removing the earner 13 from the sample chamber 14. A well-known component such as a vacuum shutter, etc. is applied to the load lock unit.

The carrier rotating member 52 enables the carrier 13 inserted into the sample chamber 14 to rotate on the x-axis.

In this way, the mesh 41 may be tilted at an arbitrary angle relative to a horizontal plane.

Figure 4:
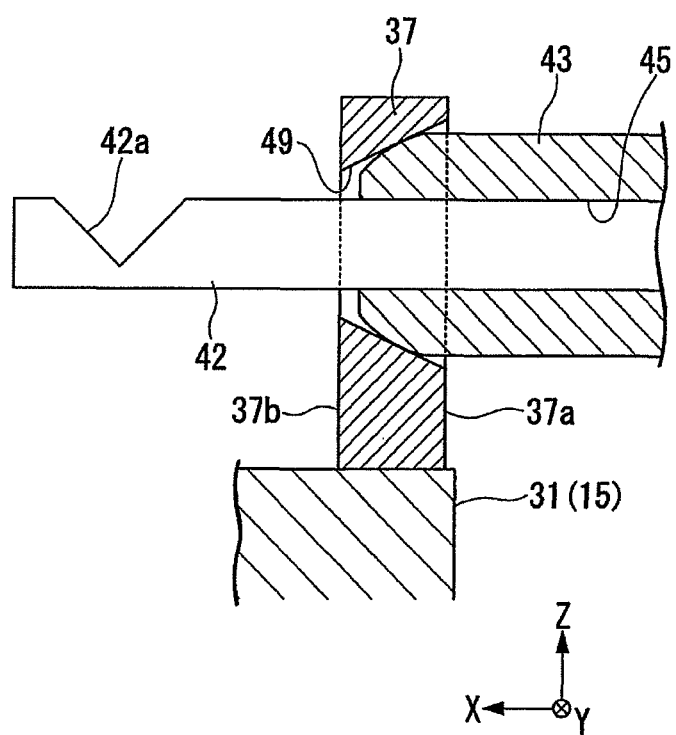
FIG. 4 is a main portion enlarged schematic view showing a carrier engagement part and a front end portion of a carrier.

FIG. 4 is a main portion enlarged schematic view showing a carrier engagement part and a front end portion of a carrier.

The carrier engagement part 37 formed on an end of the body unit 31 of the sample tray 15 is, for example, a plate shape member extending from the body unit 31 along the z-axis, and is provided with an opening 49 close to an end portion thereof. The opening 49 is, for example, a tapered hole having diameters that are gradually decreased from a surface 37a relative to an end portion side of the sample tray 15 toward a surface 37b relative to the center of the chamber. The diameters allow the holder 42 to penetrate through the opening at the surface 37a relative to the end portion side, but do not allow the holder adaptor 43 to penetrate through the opening.

The carrier engagement part 37 releasably engages the holder adaptor 43 of the carrier 13 with the sample tray 15, while the carrier 13 is inserted into the sample chamber 14 (referring to FIG. 2). For example, when the sample tray 15 is moved by using the moving member 32 along the X, Y, and Z-axes, respectively, the carrier 13 releasably engaged or fastened with the sample tray 15 through the carrier engagement part 37 is also moved along the X, Y, and Z-axes respectively, in company with the sample tray 15.

With pressurization, the holder adaptor 43 is in contact with the carrier engagement part 37 by using a pressure difference between the sample chamber 14 and the atmosphere. In this case, it is desirable to adjust the pressurization by adding a spring unit, etc. to the carrier 13 so as to prevent the sample tray 15 from being affected in operation accuracy.

In addition, when the tilting member 36 tilts the entire sample tray 15 on the x-axis, the carrier 13 engaged with the sample tray 15 through the carrier engagement part 37 is also tilted in company with the tilt of the sample tray 15. In addition, the tilted angle of the carrier 13 may be adjusted by the carrier rotating member 52.

Referring to FIG. 1 again, the sample chamber 14 includes a sample-piece moving unit 55 moving the micro sample-piece between the sample tray 15 and the carrier 13. The sample-piece moving unit 55 is, for example, a unit for moving a micro sample-piece, which is obtained by processing the sample S with a focused ion beam, placed on the sample tray 15 to the mesh 41 of the carrier 13. For example, a well-known sample-piece moving unit such as a probe 55a and a deposition gas gun 55b is applied to the sample-piece moving unit 55.

Hereinafter, operations of the apparatus 10 for processing and observing a sample (focused ion beam apparatus) 10 will be described. When the apparatus 10 for processing and observing a sample (focused ion beam apparatus) obtains a micro sample-piece for TEM from a sample (bulk) S, the carrier 13 is moved back off in the sample chamber 14 (referring to FIG. 2).

In addition, an SEM image of a position assumed where an observation target of the sample S is included is identified and moved. The outer sides and the bottom of a portion including the observation target are processed by a focused ion beam (FIB) while leaving a micro arm. In addition, a front end of a manipulator probe 55a is in contact with the micro sample-piece. Gas is supplied to the contact portion, and the contact portion is irradiated by an FIB, thereby forming a deposition layer and fixing the contact portion. Next, the micro arm is cut by using an FIB, whereby the micro sample-piece is separated from the sample (bulk sample) S.

As described above, while a micro sample-piece including an observation target object is separated from a sample S by an FIB, the manipulator probe is moved back off to an evasion position. Next, the carrier 13 is inserted into the sample chamber 14 by using the load lock unit 51. Here, a front end portion of the holder adaptor 43 of the carrier 13 contacts an edge of the circumference of the opening 49 of the carrier engagement part 37 when the carrier 13 has been inserted a predetermined distance into the sample chamber 14, and thus the front end portion of the carrier 13 is releasably engaged or fastened with the carrier engagement part 37. In addition, the holder 42 held by the holder adaptor 43 penetrates the opening 49 of the carrier engagement part 37, and the mesh 41 provided at a front end of the holder 42 is placed close to the sample load surface 33a of the turntable 33.

When the carrier 13 is inserted into the sample chamber 14, the separated micro sample-piece which is placed in the evasion position, is moved close to the mesh 41 of the carrier 13 by using the sample-piece moving unit 55. Here, the mesh 41 is moved to a beam cross point of an FIB and an SEM in advance, and the position of the micro sample-piece is adjusted by using the probe 55a to be in contact with a sample fix position of the mesh 41, and both are fixed by a deposition layer. Next, the probe 55a is separated from the micro sample-piece by FIB processing. After the separation, the probe is moved back off. Next, the position of the micro sample-piece fixed on the mesh 41 is adjusted along X, Y, Z, and T-axes, and the sample-piece is processed to be a thin film which can be observed by TEM by adjusting angles of an FIB and of the sample.

When the moving member 32 moves the body unit 31 of the sample tray 15 along X, Y, and Z-axes respectively, the mesh 41 of the carrier 13 engaged with the sample tray 15 through the carrier engagement part 37 is also moved along X, Y, and Z-axes respectively in company with the body unit 31 of the sample tray 15. In addition, when the tilting member 36 tilts the entire sample tray 15 on the x-axis, the mesh 41 of the carrier 13 engaged with the sample tray 15 through the carrier engagement part 37 is also tilted at an arbitrary angle. In addition, the tilted angle of the mesh 41 may be adjusted by the carrier rotating member 52.

In this way, when the micro sample-piece is moved on the mesh 41 of the carrier 13 by using the sample-piece moving unit 55 and is processed to be a thin film which can be observed by TEM, the carrier 13 is then removed from the sample chamber 14 through the load lock unit 51. In addition, when the carrier 13 holding the micro sample-piece is, for example, introduced into a sample chamber for TEM, a transmission image of the micro sample-piece may be obtained by using a focused ion beam.

In addition, when the micro sample-piece placed on the mesh 41 is observed while the carrier 13 is inserted into the apparatus 10 for processing and observing a sample (focused ion beam apparatus), the moving member 32 moves the body unit 31 of the sample tray 15 along the X, Y, and Z-axes respectively. Thus, the mesh 41 of the carrier 13 engaged with the sample tray 15 through the carrier engagement part 37 is also moved along X, Y, and Z-axes respectively in company with the body unit 31 of the sample tray 15. In this way, it is possible to perform observation at an arbitrary position of the micro sample-piece. In this case, a transmission electron detector 19 is provided in rear of the mesh whereby a transmission image of a thin film sample may be observed by SEM. In a case of detecting an electron that penetrates a sample as a signal, it is desirable to provide the STEM detector on a stage. In addition, when performing advanced observation such as brightness view, darkness view, angle division, etc., it is desirable to provide the STEM detector in an insertion type from the wall of the sample chamber, without providing a position adjustment device below the STEM detector or installing the STEM detector itself on a stage.

As described above, according to the apparatus 10 for processing and observing a sample (focused ion beam apparatus), the carrier 13 is fastened with the sample tray 15 through the carrier engagement part 37. Therefore, even through the side-entry-type stage is not provided with a moving unit along the X, Y, and Z-axes, the mesh 41 of the carrier 13 may be moved freely. Due to this, the side-entry-type stage may be provided in a small size, and may be lightened. In addition, both the sample tray 15 and the carrier 13 is moved by using a common position movement operating system, and thus it is easy to operate the sample tray and the carrier, and a micro sample-piece of an observation target may be easily moved by using simple configurations.

In addition, according to the apparatus 10 for processing and observing a sample (focused ion beam apparatus), it is desirable to provide an insulation member for insulation between the carrier engagement part 37 and the carrier 13. For example, as shown in FIG. 4, an insulation member may be provided on the inner circumferential surface of the opening 49 of the carrier engagement part 37. Due to this, for example, even when a carrier having a heating function is used, insulation is ensured between the holder adaptor 43 of the carrier 13 and the carrier engagement part 37, whereby it is possible to prevent the sample tray 15 from being raised in a temperature through the carrier engagement part 37.

In addition, it is desirable to provide functions of electrically detecting contact between the holder adaptor 43 and the carrier engagement part 37, of determining whether the holder adaptor is engaged with the carrier engagement part by using a switch device, and of restricting an operation range of the sample tray 15 to an area of the mesh 41. Due to this, it is possible to prevent a function of a stage being damaged by maloperation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A focused ion beam apparatus comprising:
   a sample tray on which a sample is placed;
   a focused ion beam column irradiating the sample by using a focused ion beam to obtain a micro sample-piece;
   a sample chamber receiving the sample tray and the focused ion beam column therein;
   a side-entry-type carrier insertable into and removable from the sample chamber, with a front end side of the carrier holding the micro sample-piece; and
   a sample-piece moving unit for moving the micro sample-piece between the sample tray and the carrier,
   wherein the sample tray is movable along at least an x-axis along a horizontal plane, a y-axis perpendicular to the x-axis, and a z-axis along a vertical direction respectively, and
   at an end of the sample tray, a carrier engagement part, detachably engaged to the carrier, is provided which moves the carrier in accompaniment to the movement of the sample tray along the x-axis, y-axis and z-axis.

2. The apparatus of claim 1, wherein the sample chamber is provided with a load lock unit keeping the sample chamber airtight and enabling the carrier to be inserted into and removed from the sample chamber.

3. The apparatus of claim 1, wherein the sample tray is provided with a table enabling the sample to rotate around the z-axis.

4. The apparatus of claim 1, wherein the sample chamber is provided with a tilting member enabling the sample tray to tilt around the x-axis.

5. The apparatus of claim 1, wherein the sample chamber is further provided with a carrier rotating member enabling the carrier to rotate around the x-axis.

6. The apparatus of claim 1, wherein the carrier is provided with both a holder having a mesh holding the micro sample-piece, and a holder adaptor maintaining the holder detachable.

7. The apparatus of claim 6, wherein the carrier engagement part is fastened with the holder adaptor.

8. The apparatus of claim 1, wherein the carrier engagement part further is provided with an insulation member carrying out insulation between the carrier and the carrier engagement part.

9. The apparatus of claim 1, wherein the sample chamber is further provided with a transmission electron detector for observing a transmission electron image of the micro sample-piece held on the carrier.

10. A focused ion beam apparatus comprising:
a sample chamber;
a sample tray disposed in the sample chamber for supporting a sample, the sample tray being movable along an x-axis, a y-axis perpendicular to the x-axis, and a z-axis perpendicular to the x-axis and the y-axis;
a focused ion beam column disposed in the sample chamber for irradiating the sample, while supported on the sample tray, with a focused ion beam to obtain a micro sample-piece;
a carrier insertable into and out of the sample chamber, the carrier having a front end portion configured to hold the micro sample-piece when the carrier is inserted into the sample chamber; and
a sample-piece moving unit disposed in the sample chamber and configured to move the micro sample-piece from the sample tray to the front end portion of the carrier,
wherein the sample tray has a carrier engagement part configured to releasably engage with the carrier when the carrier is inserted a predetermined distance into the sample chamber to transmit movement of the sample tray along the x-axis, y-axis and z-axis to the carrier so that movement of the sample tray is accompanied by corresponding movement of the carrier.

11. The focused ion beam apparatus according to claim 10, wherein the carrier engagement part has an opening through which the front end portion of the carrier extends when the carrier is inserted the predetermined distance into the sample chamber.

12. The focused ion beam apparatus according to claim 11, wherein the opening is a tapered opening, and the carrier has a tapered portion configured to fit in the tapered opening so that when the carrier is inserted the predetermined distance into the sample chamber, the tapered portion is received in the tapered opening and releasably engages with the carrier engagement part.

13. The focused ion beam apparatus according to claim 10, wherein the sample chamber includes a load lock unit that keeps the sample chamber airtight and enables the carrier to be inserted into and out of the sample chamber.

14. The focused ion beam apparatus according to claim 10, wherein the sample tray includes a table enabling the sample to rotate around the z-axis.

15. The focused ion beam apparatus according to claim 10, wherein the sample chamber includes a tilting member enabling the sample tray to tilt around the x-axis.

16. The focused ion beam apparatus according to claim 10, wherein the sample chamber includes a carrier rotating member enabling the carrier to rotate around the x-axis.

17. The focused ion beam apparatus according to claim 10, wherein the front end portion of the carrier is provided with a holder having a mesh for holding the micro sample-piece, and a holder adaptor that detachably holds the holder.

18. The focused ion beam apparatus according to claim 10, wherein the carrier engagement part includes an insulation member providing insulation between the carrier and the carrier engagement part.

19. The focused ion beam apparatus according to claim 10, wherein the sample chamber includes a transmission electron detector for observing a transmission electron image of the micro sample-piece held on the carrier.

* * * * *